United States Patent [19]
Lebby et al.

[11] Patent Number: 5,764,671
[45] Date of Patent: Jun. 9, 1998

[54] VCSEL WITH SELECTIVE OXIDE TRANSITION REGIONS

[75] Inventors: Michael S. Lebby, Apache Junction; Jamal Ramdani, Gilbert; Wenbin Jiang, Phoenix, all of Ariz.

[73] Assignee: Motorola, Inc., Schaumburg, Ill.

[21] Appl. No.: 734,569

[22] Filed: Oct. 21, 1996

[51] Int. Cl.$^6$ ................. H01S 3/19; H01S 3/08
[52] U.S. Cl. ................. 372/45; 372/96
[58] Field of Search ................. 372/96, 92, 45, 372/46, 43, 44, 50

[56] References Cited

U.S. PATENT DOCUMENTS

| | | | |
|---|---|---|---|
| 5,479,427 | 12/1995 | Yoshida et al. | 372/45 |
| 5,493,577 | 2/1996 | Choquette et al. | 372/96 |
| 5,557,627 | 9/1996 | Schneider, Jr. et al. | 372/96 |
| 5,586,135 | 12/1996 | Yoshida et al. | 372/45 |

OTHER PUBLICATIONS

Huang et al, "Continuous Wave Visible InGaP/InGaAlP Quantum Well Surface Emitting Laser Diodes", LEOS '93 Conference Proceedings, pp. 613–614, Nov. 1993.

Lott et al, "Gain Characteristics of Red AlGaInP VCSELs", LEOS '93 Conference Proceedings, pp. 611–612, Nov. 1993.

Schneider, Jr. et al, "Efficient Room-Temperature Continuous-Wave AlGaInP/AlGaAs Visible (670 nm) Vertical-Cavity Surface-Emitting Laser Didoes", IEEE Photonics Technology Letters, vol. 6, No. 3, pp. 313–316, Mar. 1994.

Hagerott et al, "High Efficiency AlGaInP-based 660–680 nm Vertical-Cavity Surface Emitting Lasers", Electronics Letters, vol. 31, No. 3, pp. 196–198, Feb. 1995.

Schneider, Jr. et al, "GaInAsP/AlGaInP-based near-IR (780nm) Vertical-Cavity Surface-Emitting Lasers", Electronics Letters, vol. 31, No. 7, pp. 554–556, Mar. 1995.

Ohiso et al, "1.55um Vertical-Cavity Surface-Emitting Lasers with Wafer-Fused InGaAsP/InP-GaAs/AlAs DBRs", Electronics Letters, vol. 32, No. 16, pp. 1483–1484, Aug. 1996.

*Primary Examiner*—Rodney B. Bovernick
*Assistant Examiner*—Quyen Phan Leung
*Attorney, Agent, or Firm*—Eugene A. Parsons

[57] ABSTRACT

A semiconductive substrate (101) with a surface (102) having a first stack of distributed Bragg reflectors (109) disposed on the surface (102) of the semiconductive substrate (101). A first transition region (140) is disposed on the first stack of distributed Bragg reflectors (109) with a first cladding region (113) being disposed on the first transition region (140). An active area (117) is disposed on the first cladding region (113) with a second cladding region (123) being disposed on the active area (117). A second transition region (145) having a layer (255) of aluminum arsenide is disposed on the second cladding region (123) with a second stack of distributed Bragg reflectors (127) being disposed on the second transition region (145).

20 Claims, 2 Drawing Sheets

VCSEL WITH SELECTIVE OXIDE TRANSITION REGIONS

FIELD OF THE INVENTION

This invention relates, in general, to optical devices and, more particularly, to vertical cavity surface emitting lasers.

BACKGROUND OF THE INVENTION

Recently, there has been interest in a new type of light emitting device called a vertical cavity surface emitting laser (VCSEL). Conventional VCSEL's have several potential advantages, such a planar construction, emitting light perpendicular to the surface of the die, and the possibility of array fabrication. However, design of conventional VCSEL's that emit light in the visible spectrum present several practical problems, such as poor electrical characteristics, i.e., high resistance, high threshold current, poor carrier confinement, poor optical performance, i.e., low optical gain, and the like, thus not allowing VCSEL's designed for the visible spectrum to perform.

These problems generally are caused by a mismatch of the material systems used in the fabrication of the conventional VCSEL that emit light in the visible spectrum. Several factors, such as mismatches of energy bandgap edges, mismatches of valance bands, poor carrier confinement or the like, contribute to the poor electrical and optical performance. Because of these problems, different material systems are difficult, if not impossible, to be used together. More specifically, if neither the conduction bands nor the valence bands of two different material systems match, electron and hole injection is not maximized which results in poor electrical and optical performance, thereby reducing the usefulness of VCSELs that emit light in the visible spectrum. Additionally, other problems can occur due to the physical properties of the different material systems. These problems are caused by several factors, such as stress due to mismatch of crystal lattice structure, and the like, thus further reducing the use of different materials for manufacturing VCSELs.

It can readily be seen that conventional visible VCSELs have several disadvantages and problems, thus not enabling their entry into a high volume manufacturing applications. Therefore, a VCSEL and method for making visible VCSELs that improves electrical and optical characteristics and simplifies fabrication, without undo cost would be highly desirable.

It is a purpose of the present invention to provide a new and improved vertical cavity surface emitting laser.

It is another purpose of the present invention to provide a new and improved vertical cavity surface emitting laser with improved electrical and optical characteristics.

It is still another purpose of the present invention to provide a new and improved vertical cavity surface emitting laser with reduces material layer mismatches and reduced stress.

BRIEF DESCRIPTION OF THE DRAWINGS

Referring to the drawings.

DESCRIPTION OF THE PREFERRED EMBODIMENTS

Figure 1:
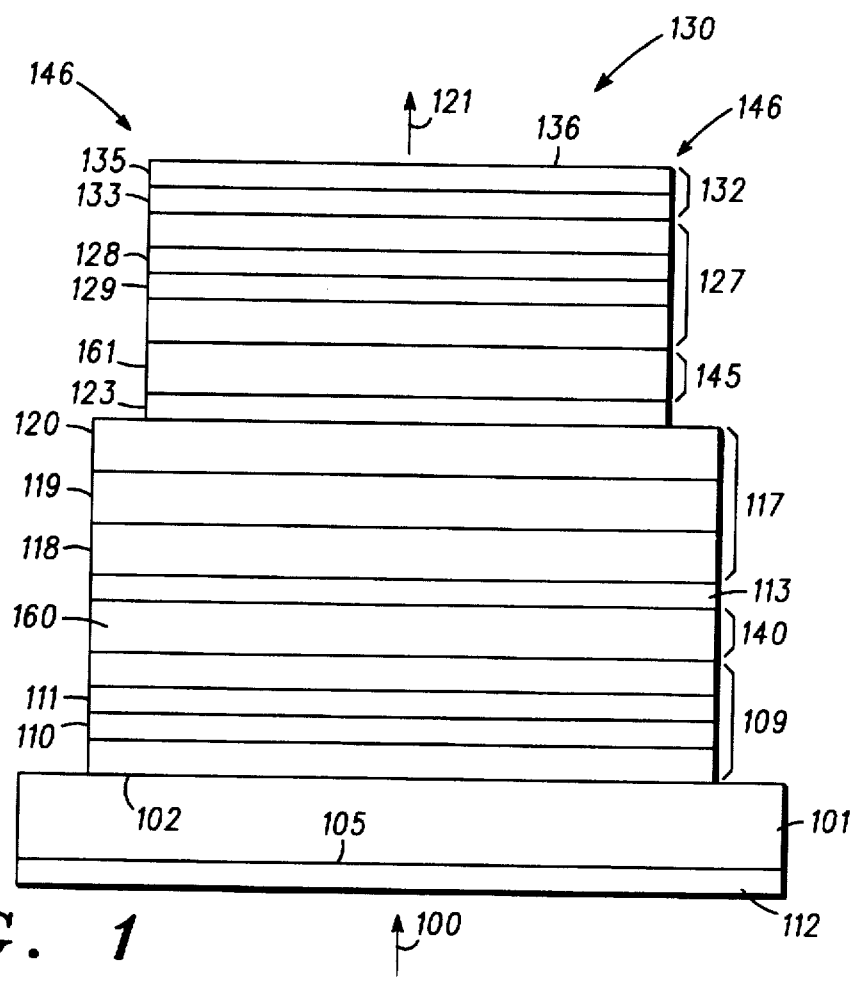
FIG. 1 is an enlarged simplified sectional view of a vertical cavity surface emitting laser.

FIG. 1 is a greatly enlarged simplified sectional view of a vertical cavity surface emitting laser (VCSEL) 100 with light, represented by an arrow 121, being emitted therefrom. It should be understood that VCSEL 100 is intended to represent any etched type of light emitting device, such as a ridge VCSEL, a planar VCSEL, or the like. As shown in FIG. 1, VCSEL 100 is made of several main elements or features, including a ridge 130 with edges 146, a substrate 101 having surfaces 102 and 105, stacks 109 and 127 of distributed Bragg reflectors, transition regions 140 and 145, cladding regions 113 and 123, an active area 117, and contact regions 112 and 132. Stacks 109 and 127 of distributed Bragg reflectors are made of a plurality of alternating layers, illustrated by layers 110 and 111 (of stack 109), and layers 128 and 129 (of stack 127). Active area 117 includes a quantum well layer 119 and barrier layers 118 and 120 with quantum well layer 119 positioned between barrier layers 118 and 120. Contact region 132 includes layers 133 and 135 with layer 135 having a surface 136. Contact region 112 is made of fusion or alloying a conductive material to lower surface 105 of substrate 101.

It should be understood that FIG. 1 is a simplified illustration in which many elements of VCSEL 100 have been purposely omitted to more clearly illustrate the present invention. Further, it should be noted that FIG. 1 is a sectional view, thereby depicting VCSEL 100 extending into an out of the figure and allowing VCSEL 100 to represent an array of light emitting devices formed on substrate 101. Additionally, it will be known by one of ordinary skill in the art that deposition or formation of material layers used to fabricate VCSEL 100 is generally achieved sequentially.

VCSEL 100 is fabricated on any suitable substrate 101 providing surface 102. Generally, substrate 101 is made of a semiconductive material, such as a silicon material, a III/V compound material, e.g., gallium arsenide (GaAs), indium phosphide (InP), or the like; however, in a preferred embodiment of the present invention, substrate 101 is made of gallium arsenide. As shown in FIG. 1, VCSEL 100 includes a plurality of material layers deposited on or overlying surface 102. Generally, stacks 109 and 127 of distributed Bragg reflectors, transition regions 140 and 145, cladding regions 113 and 123, active area 117, and contact region 132 are epitaxially deposited or formed on or overlying surface 102 by any suitable epitaxial method, such as molecular beam epitaxy (MBE), meto-organic chemical vapor deposition (MOCVD), or the like.

As shown in FIG. 1, contact region 112 is disposed on surface 105 of substrate 101. Contact region 112 provides an electrical contact for VCSEL 100. By providing contact region 112 to substrate 101, substrate 101 becomes part of an electrical path to the stack of distributed Bragg reflectors 109. Additionally, it should be understood that contact region 132 and contact region 112 provide current though stacks 109 and 127 of distributed Bragg reflectors, transition regions 140 and 145, and cladding regions 113 and 123 to inject carriers into, active area 117, thereby making a complete electrical circuit which allows light 121 to be generated and subsequently emitted from VCSEL 100.

Contact region 112 is made by any well-known method or combination of methods in the art, such as deposition (e.g., evaporation, sputtering or the like), heating (e.g., annealing), polishing (e.g., chemical mechanical polishing), or the like. Briefly and by way of example only, a conductive metal is deposited onto surface 105 of substrate 101. After the deposition, a heating step or an anneal step is performed to substrate 101, thereby annealing the conductive metal to substrate 101. However, it should be noted that other alternatives or methods are also available for electrically coupling stack 109 of distributed Bragg reflectors to an electrical source. By way of another example, stack 109 is directly coupled by exposing a portion of stack 109 by any suitable method, such as but not limited to, etching, photolithography, or the like. The exposed area is then metalized to form an electrical contact.

Generally, in conventionally fabricated VCSELs, the stacks of distributed Bragg reflectors, cladding regions, active area, and contact region are made of a single material system that is defined. For example, in a conventionally fabricated VCSEL, where the material system is based on arsine, other material systems can not be easily mixed because of problems, such as mismatches of bandgap energy, mismatches of valance bands, mismatching of crystal lattice structures, and the like. However, by not mixing different material systems, advantages of the different material systems cannot be combined, realized, or used.

In the present structure, mixing of different material systems and selective oxidation is described and used to make a superior performing VCSEL 100. Generally, stacks 109 and 127 of distributed Bragg reflectors are made of the pluralities of alternating layers, illustrated by layers 110 and 111 and layers 128 and 129, respectively. The pluralities of alternating layers are made of any suitable materials, such as gallium arsenide/aluminum gallium arsenide (GaAs/AlGaAs), aluminum gallium arsenide having varying amounts of aluminum and gallium ($Al_xGa_{1-x}As$), indium aluminum gallium phosphide having varying amounts of aluminum and gallium ($In_y(Al_xGa_{1-x})_{1-y}P$), and the like. The material used in making the plurality of alternating layers of stacks 109 and 127 of distributed Bragg reflectors provides alternating refractive indexes, thereby enabling photons generated from active area 117 to be reflected between the stacks of distributed Bragg reflectors 109 and 127 and subsequently emitted as light. Additionally, it should be understood that optical characteristics such as reflectivity are material specific and that different materials will perform differently depending upon a wavelength of light being emitted from VCSEL 100. Thus, selection of suitable materials is dependent upon material characteristics and the wavelength of the light emitted by VCSEL 100.

The pluralities of alternating layers, illustrated by layers 110 and 111 and layers 128 and 129, in stacks 109 and 127 of distributed Bragg reflectors can have any suitable number of alternating pairs. That is, with layers 110 and 111 being one alternating pair and with layers 128 and 123 being another alternating pair, the specific number of alternating pairs can be any suitable number. Generally, the number of alternating pairs ranges from twenty pairs to sixty pairs, with a preferred number ranging from twenty-five pairs to fifty-five pairs, and a nominal number of forty pairs.

Doping of stacks 109 and 127 of distributed Bragg reflectors is done by any suitable n-type dopant and p-type dopant. However, it should be understood that while one of stacks 109 or 127 is selected as being p-typed doped, the other stack 109 or 127 is n-typed doped. Generally, any suitable n-type dopant, such as selenium (Se), silicon (Si), cesium (Cs), or the like, or any suitable p-type dopant, such as carbon (C), beryllium (Be), or the like can be used. Concentrations of these dopants can range from $1E15\ cm^{-3}$ to $1E20\ cm^{-3}$, with a preferred range from $1E16\ cm^{-3}$ to $1E20\ cm^{-3}$, with a nominal range from $1E17\ cm^{-3}$ to $1E19\ cm^{-3}$, with a nominal value of $1E18\ cm^{-3}$.

Transition regions 140 and 145 are included to allow for a smooth conversion from one material system to a different material system. Transition regions 140 and 145 will be described in greater detail with regard to FIGS. 2 and 3. Briefly, with regard to FIG. 1, transition regions 140 and 145 are made of either a single layer or a plurality of layers of any suitable material or combination of materials that bridge or step from one material system to another different material system, thereby slowly grading the change from one material system to the other different material system. For example, with stacks 109 and 127 being made with an arsine based material system and with the active area 117 being made with a phosphorous based material system, transition regions 140 and 145 traverse the two material systems, thereby allowing the two material systems to be used simultaneously. The thicknesses, designated 160 and 161, of transition regions 140 and 145 can be any suitable thickness. In a preferred embodiment of the present invention, thicknesses 160 and 161 individually range from 12 to 800 Angstroms, with a preferred range from 40 to 400 Angstroms, and a nominal range from 60 to 300 Angstroms.

Doping of transition regions 140 and 145 is consistent with the adjacent distributed Bragg reflector of stacks 109 or 127. For example, if stack 109 is n-typed doped with silicon at a concentration of $1E18\ cm^{-3}$, then at least a portion of transition region 140 will be n-typed doped with silicon at a concentration of $1E18\ cm^{-3}$, thereby matching the doping type and concentration of its adjacent distributed Bragg reflector.

While cladding regions 113 and 123 are illustrated in this example as a single layer, it should be understood that cladding regions 113 and 123 can be made of a plurality of layers. Cladding regions 113 and 123 are located with cladding region 113 being on one side of active area 117 and cladding region 123 being on the other side of active area 117. Cladding regions 113 and 123 are made of the material system that is used in active area 117. For example and in accordance with the preferred embodiment of the present invention, if active area 117 is made with an arsine material system, then cladding regions 113 and 123 will be made with an arsine material system. Alternatively, if active area 117 is made with a phosphorous material system, then cladding regions 113 and 123 will be made with a phosphorous material system.

Generally, doping of cladding regions 113 and 123 is dependent upon whether cladding regions 113 and 123 are made of a single layer or a plurality of layers. If cladding regions 113 and 123 are made of a single layer, then cladding regions 113 and 123 are not doped. However, if cladding regions 113 and 123 are made of a plurality of layers, then at least a portion of the plurality of layers of cladding regions 113 and 123 are doped. With cladding regions 113 and 123 being made of a plurality of layers, the doping of the portion to be doped is consistent with the adjacent transition region and its adjacent distributed Bragg reflectors. For example, if stack 109 and transition region 140 are n-typed doped with silicon at a concentration of $1E18\ cm^{-3}$, then cladding region 113 will be n-typed doped with silicon at a concentration of $1E18\ cm^{-3}$, thereby matching the doping type and concentration of its adjacent distributed Bragg reflector and transition region.

As shown in FIG. 1, active area 117 includes barrier layers 118 and 120 with quantum well layer 119 disposed therebetween. However, it should be understood that active area 117 is illustrated in its simplest form and that active area 117 can include a plurality of barrier layers and a plurality of quantum well layers.

Quantum well layer 119 and barrier layers 118 and 120 are made of any suitable material, such as gallium arsenide, aluminum gallium arsenide, indium gallium phosphide, indium aluminum gallium phosphide, or the like. Selection of materials used in active area 117 is dependent on the wavelength of light at which VCSEL 100 is chosen to operate. Additionally, quantum well layer 119 and barrier layers 118 and 120 are made with any suitable thickness. In a preferred embodiment of the present invention, thicknesses of quantum well layer 119 and barrier layers 118 and 120 range from 50 Angstroms to 125 Angstroms, with a preferred range from 75 Angstroms to 100 Angstroms, and with a nominal value of 85 Angstroms. However, it should be understood that the combined thickness of active area 117 and cladding regions 113 and 123 generally is one wavelength of the emitted light or a multiple thereof.

Contact region 132 typically includes layers 133 and 135 made with the same materials that are used in stacks 109 and 127 of distributed Bragg reflectors. However, while layers 133 and 135 are made of similar materials and dopants as stack 127, layers 133 and 135 have a higher concentration of dopant to provide good electrical conductivity. For example and in accordance with the preferred embodiment of the present invention, if stacks 109 and 127 are made of AlGaAs, then layers 133 and 135 will be made of AlGaAs. However, layers 133 and 135 are more heavily doped than stacks 109 and 127. Generally, layers 133 and 135 are heavily doped having doping concentrations with regard to layer 133 ranging from 1E15 to 1E20 $cm^{-3}$, with a preferred range from 1E16 to 1E20 $cm^{-3}$, with a nominal range from 1E17 to 1E19 $cm^{-3}$, and with a nominal value of 1E18 $cm^{-3}$ and with doping concentrations for layer 135 ranging from 1E17 to 1E20 $cm^{-3}$, with a preferred range from 1E18 to 1E20 $cm^{-3}$, and a nominal range from 1E19 to 1E20 $cm^{-3}$, with a nominal value of 1E19 $cm^{-3}$.

Once the material layers have been fabricated on substrate 101, the material layers are patterned by any suitable method or combination of methods, such as photolithography, etching, deposition, or the like. Generally, a dot pattern is formed by a photolithography process on the material layers where portions of the material layers are exposed and where portions of the material layers are covered by the dot pattern. The dot pattern is then etched by any suitable technique such as dry etching or wet etching where the portions that are exposed are removed while the covered portions are not removed, thereby forming ridge 130. By forming ridge 130, edges 146 of cladding regions 123, transition region 145, stack 127 of distributed Bragg reflector, and contact region 132 are either exposed or partially exposed.

Figure 2:
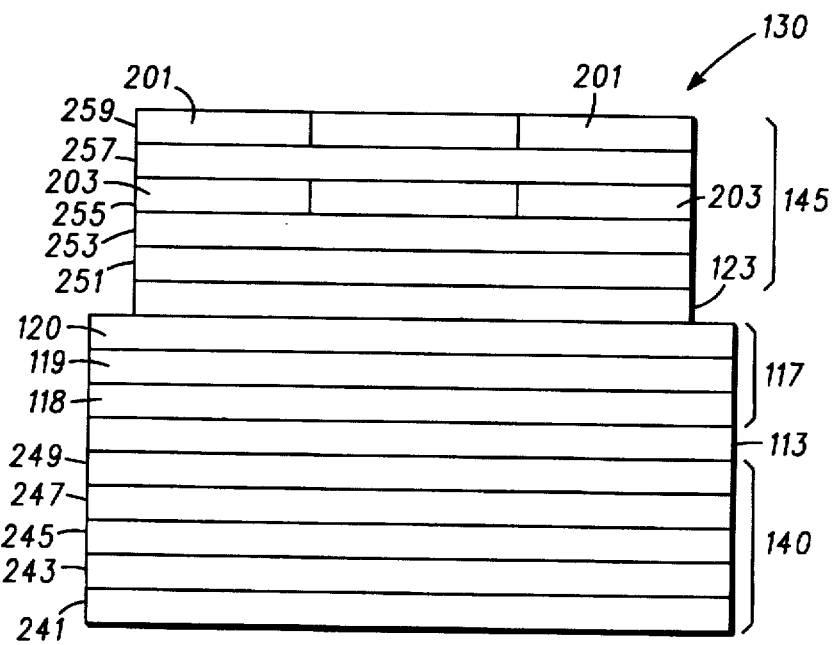
FIG. 2 is a greatly enlarged sectional view of a portion of a vertical cavity surface emitting laser.

Referring to FIG. 2, a greatly enlarged sectional view of a portion of VCSEL 100 is illustrated, showing a specific embodiment of transition regions 140 and 145. In this example, transition region 140 includes layers 241, 243, 245, 247, and 249 and transition region 145 includes layers 251, 253, 255, 257, and 259. Also included in FIG. 2 are portions 201 and 203, cladding regions 113 and 123, and active area 117. It should be understood that similar features or elements used previously will retain there original identifying numerals for ease of identification.

In this specific example, substrate 101 is made of gallium arsenide, with stacks 109 and 127 of distributed Bragg reflectors being based on an arsine material system, e.g., the plurality of alternating layers are made of $Al_{(0.5)}Ga_{(0.05)}AS$/AlAS. Also, active area 117 is based on a phosphorous material system, e.g., barrier layers 118 and 120 are made of indium aluminum gallium phosphide and quantum well layer 119 is made of indium gallium phosphide. Transition region 140 is made with layers 241, 243, 245, 247, and 249 and transition region 145 is made with layers 251, 253, 255, 257, and 259, which are used to gradually grade or transition from the arsine material system used in stacks 109 and 127 to the phosphorous based material system in active area 117. The multiple layer method is a more uniformly controlled method to change from the arsine material system to the phosphorous based material system, which provides excellent electrical and optical properties. In the following discussion it should be understood that like materials used in transition regions 140 and 145 will be discussed together.

In the present embodiment, layers 241, 245, 255, and 259 are made of aluminum arsenide (AlAs) which matches the AlAs that is used in stacks 109 and 127. It should be noted that layers 241 and 259 can be considered as part of or an extension of stacks 109 and 127. Additionally, as shown in FIG. 2, layers 255 and 259 have portions 201 and 203 that have been oxidized to form an area of aluminum oxide $(Al_{(x)}O_{(x)}$, e.g., $Al_2O_3)$. It should be noted that FIG. 2 is a sectional view and in this embodiment portions 201 and 203 extend around behind the figure to coalesce, thereby defining portions 201 and 203 with a circular shape, thus, confining current carriers more centrally to active area 117.

Oxidation of portions 201 and 203 is achieved by any suitable oxidizing method, such as exposure to heated oxygen source, exposure to steamed, or the like. Typically, these method are carried out in a reaction chamber that is capable of controlling several process parameters, such as temperature, pressure, gas input, and the like. Generally, control of the oxidation of portions 201 and 203 is achieved by varying process parameters, such as oxygen (O), steam $(H_2O)$, and the like. Additional control of the oxidation of portions 201 and 203 is achieved by material selection of layers 255 and 259. Using the oxidation process for VCSEL lateral current confinement has been described in U.S. Pat. No. 5,359,618, entitled "High Efficiency VCSEL and Method of Fabrication", issued Oct. 25, 1994, and assigned to the same assignee.

By way of example, with layers 319 and 324 being $Al_{(x)}Ga_{(x)}AS$, the percent concentration aluminum and the percent concentration of gallium can be changed to either enhance oxidation or reduce oxidation of the $Al_{(x)}Ga_{(x)}AS$. Generally, with increased aluminum composition, formation of aluminum oxide is increased, thereby increasing the rate and amount of aluminum oxide formation. Generally, the oxidation temperature ranges from 200 to 400 degrees Celsius, with a nominal range from 250 to 350 degrees Celsius, and nominal value of 300 degrees Celsius. The oxidation pressure ranges from one atmosphere to ten atmospheres. By oxidizing portions 201 and 203 of layers 255 and 259, several advantages are realized but not limited to, improved carrier confinement, decreased series resistance, and the like, which improves optical gain and lowers the threshold current of VCSEL 100.

Layers 243 and 257 are made of indium aluminum arsenide (InAlAs), thereby adding indium into transition regions 140 and 145. The addition of indium to the chemical composition of layers 243 and 257 changes the bandgap energy to more closely approximate the bandgap energy of the active area 117, thereby grading the arsenide material system to the phosphide material system with control. However, so as to provide superior performance, layers 245, 247 and 249 and layers 251, 253, and 255 are added to transition regions 140 and 145 to provide a gradual match of bandgap energies and a gradual and smooth transition from arsine based material to the phosphorous based material during the growth in an epitaxial reactor.

It should be understood that addition or removal of elements of transition regions 140 and 145 can be achieved by any suitable method or technique. For example, in layers 243 and 257, phosphorous can be slowly introduced by gradually increasing the amount of phosphorous in a reaction mixture used for depositing layers 243 and 257. Alternatively, in layers 243 and 257, indium can be stepped with increasing amounts of indium until a desired amount is achieved in layers 243 and 257. Additionally, in yet another approach, indium and arsenic concentrations can be adjusted simultaneously. For example and in the case of transition region 140, phosphorous can be gradually introduced into a reaction mixture while arsenic is gradually removed from that reaction. Thus, at completion of transition region 140 arsenic concentration is low or nonexistent while phosphorous concentration is at the appropriate level ready for deposition of cladding layer 113. It should be understood that transition region 145 would be treated similarly but in reverse order.

Layers 247 and 253 are made of indium aluminum arsenide phosphide, e.g. $In_{0.5}(Al_xAs_{1-x})_{0.5}P$, thereby adding a layer that contains a component of phosphorous into transition regions 140 and 145. Layers 247 and 253 modify the bandgap to gradually bring the bandgap energy closer to that of active area 117 which in this embodiment is based on a phosphorous material system.

Layers 249 and 251 are made of indium aluminum phosphide (InAlP), thereby producing a material layer having elements of indium, aluminum, and phosphorous. In this particular embodiment layers 249 and 251 have a bandgap that is compatible with cladding regions 113 and 123, respectively, and active area 117. By providing layers 249 and 251 with bandgaps similar to cladding regions 113 and 123 and by introducing elements of indium and phosphorous into layers 249 and 251, the bandgap energies, electron valences, and crystal structure provide for a smooth transition from stacks 109 and 127 of arsine based distributed Bragg reflectors to phosphorous based cladding regions 113 and 123 and eventually to active area 117.

While barrier layers 118 and 120 and quantum well layer 119 have been described in general with reference to FIG. 1, in the present embodiment, barrier layers 118 and 120 and quantum well layer 119 are made of indium aluminum gallium phosphide and indium gallium phosphide, respectively. However, it should be understood that other phosphorous based material systems can also be used.

Figure 3:
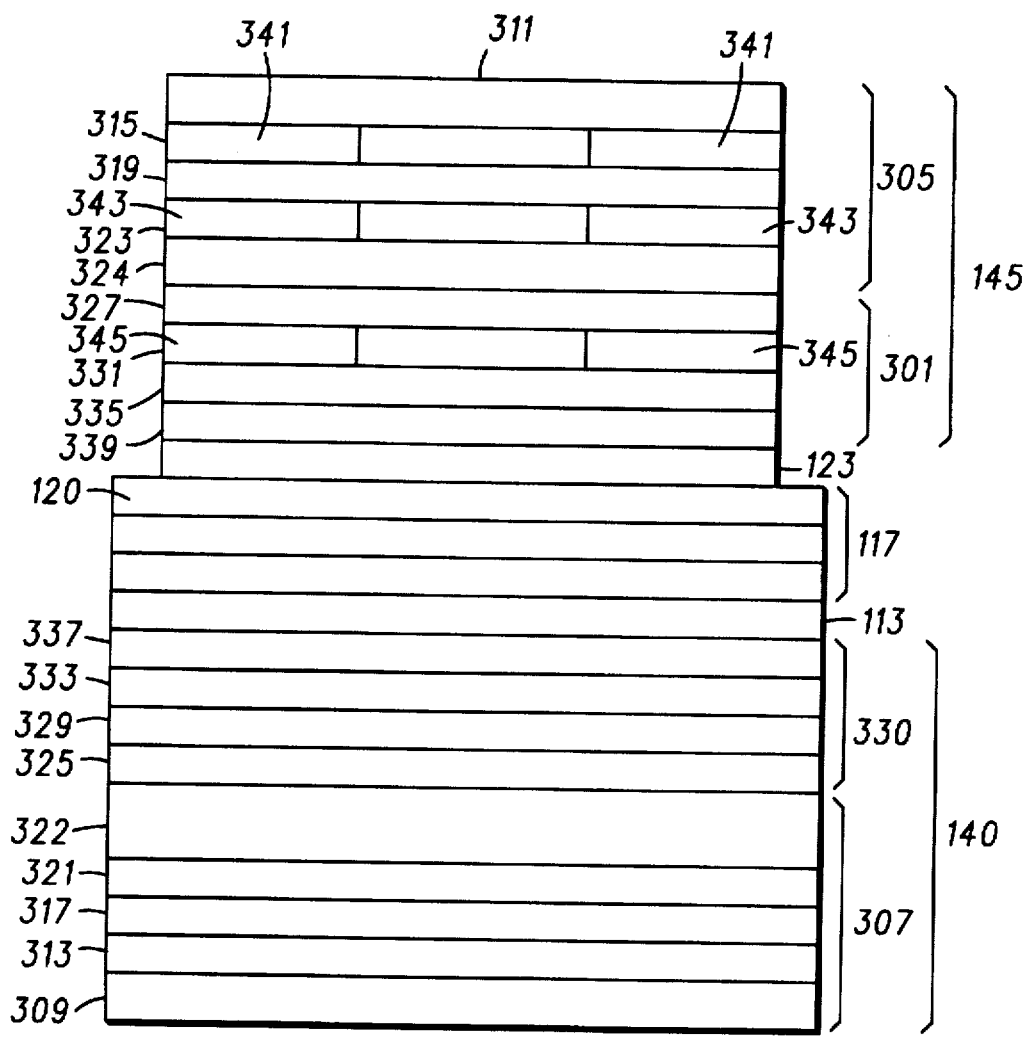
FIG. 3 is another greatly enlarged sectional view of a portion of a vertical cavity surface emitting laser.

Referring to FIG. 3, a greatly enlarged sectional view of a portion of VCSEL 100 showing another embodiment of transition regions 140 and 145 is illustrated. The structure illustrated in FIG. 3 also shows transition areas 301 and 303 and interface areas 305 and 307, cladding regions 113 and 123, and active area 117. Similar features or elements used previously in conjunction with FIG. 1 will retain there original identifying numerals for ease of identification. Transition area 301 is illustrated as including layers 327, 331, 335, and 339 with layer 331 having a portion 345. Transition area 303 is illustrated as including layers 325, 329, 333, and 337. Interface area 305 is illustrated as including layers 315, 319, 323 and 324, while interface area 307 is illustrated as including layers 313, 317, 321 and 322.

In the present embodiment, transition areas 301 and 303 are part of an optical cavity (not shown) which has a length of one wavelength (at the emitted light) or multiple integers thereof. Interface areas 305 and 307 are added to transition regions 140 and 145 to provide additional carrier confinement and ease of epitaxial material transition from one material base (in this embodiment arsine) to another material base (in this embodiment phosphorous) for VCSEL 100. Interface areas 305 and 307 each include a plurality of alternating layers of aluminum arsenide (AlAs) and aluminum gallium arsenide (AlGaAs). Interface areas 305 and 307 are part of the distributed Bragg reflectors with each layer component constructed to have a quarter wavelength thickness. Interface areas 305 and 307 allow for oxidation of the layers 315 and 323 within the distributed Bragg reflectors structure.

For example, as shown in FIG. 3, layers 315 and 323 are made of AlAs with layers 319 and 324 being made of AlGaAs. Layers 315 and 323 are illustrated with portions 341 and 343 in which portion 341 and 343 (and portion 345 of layer 331) have been oxidized. Portions 341 and 343 include oxidized AlAs where the aluminum component of the aluminum arsenide is oxidized to $Al_2O_3$ and the arsenic component of the AlAs is volatilized away.

Control of oxidation of layers 315, 323, and 331 is achieved by varying process parameters, such as temperature, time, pressure, and the like involved in exposing the AlAs to an oxidizing material such as oxygen ($O_2$), steam ($H_2O$) or the like. Oxidation of layers 319 and 324 is controlled by material selection and varying amounts of percent composition of the material selected. For example, with layers 319 and 324 being $Al_{(x)}Ga_{(x)}As$, the percent concentration aluminum and the percent concentration of gallium can be changed to either enhance oxidation or reduce oxidation of the $Al_{(x)}Ga_{(x)}AS$. Generally, the percent concentration of aluminum and gallium can range from 80 to 20 percent, with a preferred range from 70 to 30 percent, with a nominal range from 60 to 40 percent, and a nominal value of 50 percent. However, it should be understood that the aluminum percent concentration and the gallium percent concentration are linked, e.g., if the percent concentration of aluminum is 60 percent, the percent concentration of gallium is 40 percent.

The plurality of alternating layers in interface areas 305 and 307 can be any suitable number of alternating pairs, with layers 315 and 319, for example, being considered a pair. Generally, the number of alternating pairs ranges from 1 to 100, with a preferred range from 5 to 50, with a nominal range from 6 to 25, and with nominal number of 10. Transition areas 301 and 303 are positioned between stacks 127 and 109 of distributed Bragg reflectors through surfaces 311 and 309, respectively. Transition areas 301 and 303 are similar to transition regions 140 and 145 as described in conjunction with FIG. 2.

By now it should be appreciated that a novel article and method for making have been provided. A vertical cavity surface emitting laser is disclosed having improved performance over all, as well as in the visible spectrum. Specifically, by providing oxidized portions in the vertical cavity surface emitting laser, the vertical cavity surface emitting laser has improved carrier confinement, a lower resistance, and lower threshold current with accompanying improved electrical performance and optical gain. These advantages also result from a closer match of energy bandgap edges by matching different material system through the transition regions. Additionally, since the transition regions are easily integrated in the process flow of the vertical cavity surface emitting device, the vertical cavity surface emitting device is highly manufacturable, thus reducing overall costs and allowing significant improvements in reliability and quality.

While we have shown and described several specific embodiments of the present invention, further modification and improvement will occur to those skilled in the art. We desire it to be understood, therefore, that this invention is not limited to the particular forms shown and we intend in the appended claims to cover all modification that do not depart from the spirit and scope of this invention.

What is claimed is:

1. A vertical cavity surface emitting laser with selective oxide transition regions comprising:

a semiconductive substrate with a surface;

a first stack of distributed Bragg reflectors disposed on the surface of the semniconductive substrate, the first stack of distributed Bragg reflectors including a first plurality of alternating layers;

a first transition region disposed on the first stack of distributed Bragg reflectors, the first transition region having a first layer including aluminum arsenide with a first thickness, a second layer including indium aluminum arsenide with a second thickness, a third layer including aluminum arsenide with a third thickness, a fourth layer including indium aluminum arsenide phosphide with a fourth thickness, and a fifth layer including indium aluminum phosphide having a fifth thickness, at least the fourth and fifth layers being composed to transition from an arsenide material system in the first stack of distributed Bragg reflectors to a phosphide material system;

a first cladding region disposed on the fifth layer of the first transition region, the first cladding region being formed of a phosphide material system;

an active area disposed on the first cladding region, the active area including a first barrier layer, a second barrier layer, and a quantum well layer positioned therebetween, the active area being formed from alloys of material in a phosphide material system;

a second cladding region disposed on the active region, the second cladding region being formed of a phosphide material system;

a second transition region disposed on the second cladding region, the second transition region having a sixth layer including indium aluminum phosphide with a sixth thickness, a seventh layer including indium aluminum arsenide phosphide with a seventh thickness, an eighth layer including aluminum arsenide with an eighth thickness and the eighth layer having a third portion being selectively oxidized adjacent an outer portion to define a central unoxidized lasing area, a ninth layer including indium aluminum arsenide with a ninth thickness, and a tenth layer including aluminum arsenide with a tenth thickness and the tenth layer having a fourth portion being selectively oxidized adjacent an outer portion to define a central unoxidized lasing area, at least the sixth and seventh layers being composed to transition from a phosphide material system in the second cladding region to an arsenide material system; and a second stack of distributed Bragg reflectors disposed on the second transition region, the second stack of distributed Bragg reflectors including a second plurality of alternating layers.

2. A vertical cavity surface emitting laser with selective oxide transition regions as claimed in claim 1 wherein the sixth thickness of the sixth layer has a range from a monomolecular layer to 1,000 Angstroms.

3. A vertical cavity surface emitting laser with selective oxide transition regions as claimed in claim 2 wherein the sixth thickness of the sixth layer has a range from 50 Angstroms to 500 Angstroms.

4. A vertical cavity surface emitting laser with selective oxide transition regions as claimed in claim 3 wherein the sixth thickness of the sixth layer has a range form 100 Angstroms to 250 Angstroms.

5. A vertical cavity surface emitting laser with selective oxide transition regions as claimed in claim 1 wherein the seventh thickness of the seventh layer has a range from a monomolecular layer to 1,000 Angstroms.

6. A vertical cavity surface emitting laser with selective oxide transition regions as claimed in claim 5 wherein the seventh thickness of the seventh layer has a range from 50 Angstroms to 500 Angstroms.

7. A vertical cavity surface emitting laser with selective oxide transition regions as claimed in claim 6 wherein the seventh thickness of the seventh layer has a range form 100 Angstroms to 250 Angstroms.

8. A vertical cavity surface emitting laser with selective oxide transition regions as claimed in claim 1 wherein the eighth thickness of the eighth layer has a range from a monomolecular layer to 1,000 Angstroms.

9. A vertical cavity surface emitting laser with selective oxide transition regions as claimed in claim 8 wherein the eighth thickness of the eighth layer has a range from 50 Angstroms to 500 Angstroms.

10. A vertical cavity surface emitting laser with selective oxide transition regions as claimed in claim 9 wherein the eighth thickness of the eighth layer has a range form 100 Angstroms to 250 Angstroms.

11. A vertical cavity surface emitting laser with selective oxide transition regions as claimed in claim 7 wherein the ninth thickness of the ninth layer has a range from a monomolecular layer to 1,000 Angstroms.

12. A vertical cavity surface emitting laser with selective oxide transition regions as claimed in claim 11 wherein the ninth thickness of the ninth layer has a range from 50 Angstroms to 500 Angstroms.

13. A vertical cavity surface emitting laser with selective oxide transition regions as claimed in claim 12 wherein the ninth thickness of the ninth layer has a range form 100 Angstroms to 250 Angstroms.

14. A vertical cavity surface emitting laser with selective oxide transition regions as claimed in claim 1 wherein the tenth thickness of the tenth layer has a range from a monomolecular layer to 1,000 Angstroms.

15. A vertical cavity surface emitting laser with selective oxide transition regions as claimed in claim 14 wherein the tenth thickness of the tenth layer has a range from 50 Angstroms to 500 Angstroms.

16. A vertical cavity surface emitting laser with selective oxide transition regions as claimed in claim 15 wherein the tenth thickness of the tenth layer has a range form 100 Angstroms to 250 Angstroms.

17. A vertical cavity surface emitting laser with selective oxide transition regions as claimed in claim 1 wherein the quantum well layer includes indium gallium phosphide having an eleventh thickness.

18. A vertical cavity surface emitting laser with selective oxide transition regions as claimed in claim 17 wherein the eleventh thickness of the quantum well layer has a range from 80 Angstroms to 100 Angstroms.

19. A vertical cavity surface emitting laser with selective oxide transition regions as claimed in claim 1 wherein the quantum well layer includes indium aluminum gallium phosphide.

20. A vertical cavity surface emitting laser with graded transition region comprising:

a semiconductive substrate with a surface;

a first stack of distributed Bragg reflectors disposed on the surface of the semniconductive substrate, the first stack of distributed Bragg reflectors including a plurality of alternating layers;

a first interface region disposed on the first stack of distributed Bragg reflectors, the first interface region having a second plurality of alternating layers, the second plurality of alternating layers having a first layer including aluminum gallium arsenide and a second layer including aluminum gallium arsenide with the first layer including aluminum gallium arsenide having a first aluminum percent concentration, a first gallium percent concentration, and a first arsenide concentration;

a first transition region disposed on the first interface region, the first transition region including a first layer including indium aluminum arsenide, a second layer including aluminum arsenide, a third layer including indium aluminum arsenide phosphide, and a fourth layer including indium aluminum phosphide;

a first cladding region disposed on the first transition region, the first cladding region having a fourth layer including indium, aluminum phosphide;

an active area disposed on the first cladding region, the active area including a first barrier layer, a second barrier layer, and a quantum well positioned between the first barrier layer and the second barrier layer;

a second cladding region disposed on the active area, the second cladding region having a fifth layer including indium aluminum phosphide;

a second transition region disposed on the second cladding region, the second transition region having a sixth layer including indium aluminum phosphide having a first thickness, a seventh layer including indium aluminum arsenide phosphide having a second thickness, and an eighth layer including aluminum arsenide having a third thickness with a portion of the eighth layer being selectively oxidized adjacent an outer portion to define a central unoxidized lasing area, at least the sixth and seventh layers being composed to transition from a phosphide material system in the second cladding region to an arsenide material system, and a ninth layer including indium aluminum arsenide having a fourth thickness;

a second interface region disposed on the second transition area, the second interface region having a third plurality of alternating layers, the third plurality of alternating layers having a tenth layer including aluminum gallium arsenide, an eleventh layer including aluminum arsenide a twelfth layer including aluminum gallium arsenide, a thirteenth layer including aluminum arsenide, and a fourteenth layer including aluminum gallium arsenide, with the tenth and twelfth layers including aluminum gallium arsenide having a second aluminum percent concentration, a second gallium percent concentration and a second arsenide concentration and the eleventh and thirteenth layers being selectively oxidized adjacent an outer portion to define a central unoxidized lasing area; and a second stack of distributed Bragg reflectors disposed on the second interface region the second stack of distributed Bragg reflectors including a fourth plurality of alternating layers.

* * * * *

UNITED STATES PATENT AND TRADEMARK OFFICE
CERTIFICATE OF CORRECTION

PATENT NO. : 5,764,671
DATED : June 9, 1998
INVENTOR(S) : Michael S. Lebby et al.

It is certified that error appears in the above-identified patent and that said Letters Patent is hereby corrected as shown below:

In Claim 1, column 9, line 11, delete "semniconductive" and insert --semiconductive--.

In Claim 4, column 10, line 3, delete "form" and insert --from--.

In Claim 7, column 10, line 15, delete "form" and insert --from--.

In Claim 10, column 10, line 27, delete "form" and insert --from--.

In Claim 13, column 10, line 39, delete "form" and insert --from--.

In Claim 16, column 10, line 51, delete "form" and insert --from--.

Signed and Sealed this

Sixteenth Day of February, 1999

Attest:

Attesting Officer

*Acting Commissioner of Patents and Trademarks*